United States Patent [19]
Withers et al.

[11] Patent Number: 5,351,007
[45] Date of Patent: Sep. 27, 1994

[54] SUPERCONDUCTING MAGNETIC RESONANCE PROBE COIL

[75] Inventors: Richard S. Withers, Sunnyvale; Guo-Chun Liang, Cupertino, both of Calif.

[73] Assignee: Conductus, Inc., Sunnyvale, Calif.

[21] Appl. No.: 891,591

[22] Filed: Jun. 1, 1992

[51] Int. Cl.$^5$ .............................................. G01V 3/00
[52] U.S. Cl. ...................................... 324/322; 505/844
[58] Field of Search ................. 324/318, 322, 307; 333/995, 33, 170, 177, 168, 180; 505/844, 866

[56] References Cited

U.S. PATENT DOCUMENTS

| | | |
|---|---|---|
| 2,657,310 | 10/1953 | Runft ................................... 333/177 |
| 4,793,356 | 12/1988 | Misic et al. .......................... 324/322 |
| 4,894,629 | 1/1990 | Okamura et al. ................... 333/177 |
| 4,981,838 | 1/1991 | Whitehead ........................... 333/995 |

*Primary Examiner*—Louis Arana
*Attorney, Agent, or Firm*—Kimberley Elcess; James J. Leary; Judith A. DeFranco

[57] ABSTRACT

A broadband matching network for coupling a magnetic resonance probe to a preamplifier utilizes superconducting matching coils and superconducting locatable shields to detect very weak magnetic signals over a broad bandwidth. The superconducting matching coils and shields minimize signal loss in the matching amplifier. When used with a superconducting magnetic resonance probe, the circuit provides a significant broadening in bandwidth over that of the probe without loss of performance.

23 Claims, 6 Drawing Sheets

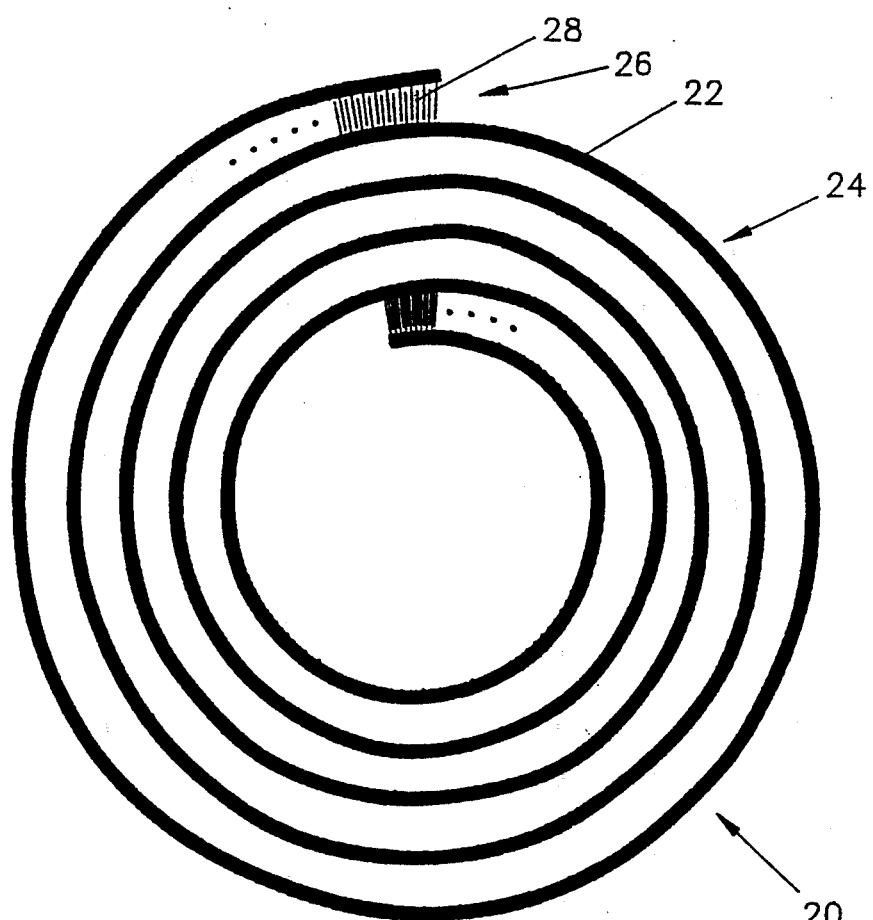
FIG. 1
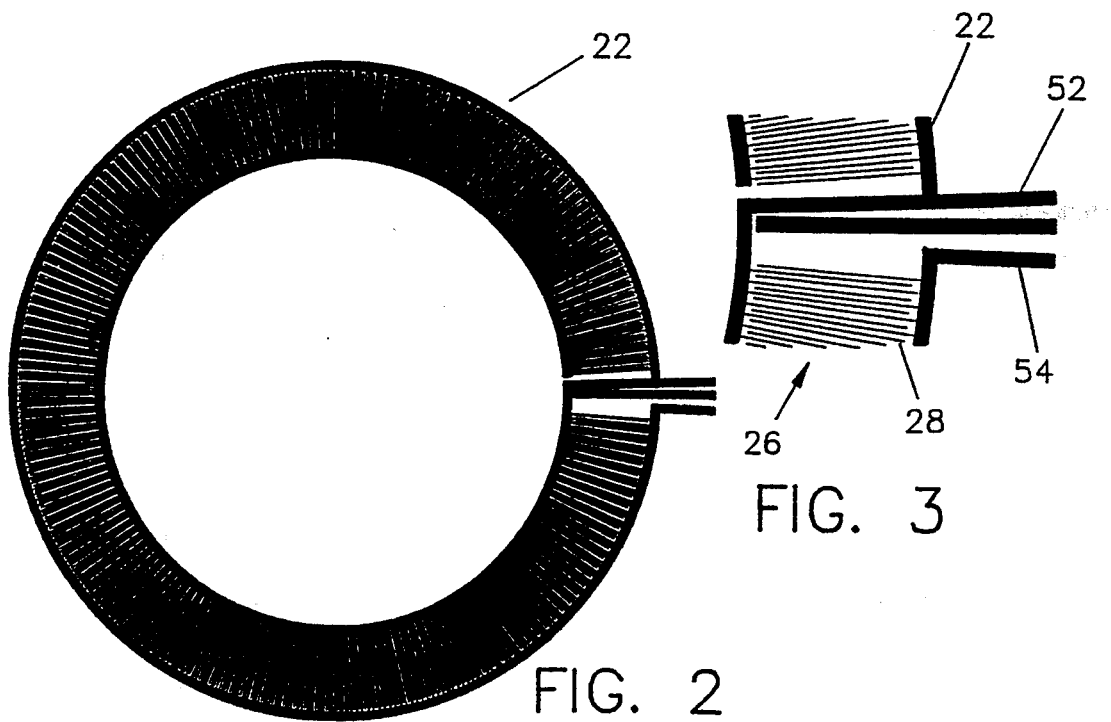
FIG. 2
FIG. 3 fc= 18.5435 MHZ    SWEEP= 10 KHZ

SUPERCONDUCTING MAGNETIC RESONANCE PROBE COIL

FIELD OF THE INVENTION

This invention relates to a superconducting network used to match impedances of an imaged object and a detector over a wide range of frequencies. More particularly, it relates to a design for a superconducting broadband matching network suitable for use in a magnetic resonance imaging system for medical or other applications.

BACKGROUND OF THE INVENTION

For certain applications, it is desirable to have a magnetic loop sensor, tuned by the addition of capacitance to resonate in the frequency range of 1–1000 MHz. In order to detect very weak magnetic fields such a sensor must generate extremely low levels of noise and consequently must have extremely low resistance and hence low loss. The lowest loss sensors are made of superconductor materials. Until recently, all superconductor materials had to be cooled below 30K to operate as superconductors. This requirement added significantly to the cost and complexity of systems which relied on these materials. The sensor design described here is one appropriate to high temperature superconductors, i.e., superconductor materials whose critical temperature is higher than 30K. This latter class of materials, also known as cuprates, oxide superconductors and perovskites, is better suited to use in thin film form than in bulk forms. This physico-chemical difference necessitates new device and circuit designs to make these materials useful in superconducting applications. The design can also be fabricated using conventional superconductors, like niobium, which are available in thin film form.

This invention consists of a multi-turn spiral coil (having inductance L) with an internal distributed interdigital capacitor (having capacitance C). The device operates in a self-resonant mode. For certain magnetic resonance imaging (MRI) applications, resonant frequencies of approximately 5 MHz and sufficiently low resistance that the coil has a resonant quality factor (Q) of not less than $10^4$, and even as high as $10^6$, are desired. The low resistances implied by these high values of Q ensure that the coil's internally generated thermal noise will be less than the noise generated by other noise sources within the imaging system, such as the tissue or object being imaged or the preamplifier coupled to the coil. To achieve such high Q, it is necessary that the equivalent series resistance of the LC resonator be less that approximately 100 $\mu\Omega$ to 1 m$\Omega$. Such low resistance is achieved by the use of superconducting thin-film metallization in both the coil and the capacitor. A key advantage of this approach is that the sensor can be produced with a single superconductive film, and as a result it is more easily and reproducibly manufactured.

DISCUSSION OF THE PRIOR ART

Previous resonant magnetic sensors for the detection of fields in the frequency range of 1 to 1000 MHz have been made using normal metals such as copper which are not superconducting. Because of the resistivity of copper, these sensors have been limited to resistances exceeding many m$\Omega$ and to quality factors of at most a few thousand. This is adequate for most applications, for example in MRI machines with very strong magnetic fields (approximately 1 Tesla or more), but not in applications in which the signal levels are low. Thin film versions of the sensors made with normal metals have even lower Qs, precluding the use of thin film technology.

This invention is different in that it uses superconducting materials to drastically improve the Q of the resonant sensor. High quality superconductors of the high temperature variety are most readily available in thin film (rather than bulk or wire) form. This requires a different physical design of inductor and capacitor than is used for a bulk, normal metal version. In the embodiment shown in FIG. 1, the inductor (which actually intercepts the magnetic signal) consists of a spiral of a few or several turns, and the capacitor consists of interdigitated combs distributed throughout the inductor. The spiral may be made of a true spiral, of spirally connected concentric circles, or of spirally connected line segments. The use of superconductive metallization is essential to achieving the low loss (and hence high Q) behavior of both the inductor and capacitor. Photolithographic techniques are utilized to pattern the circuit to dimensions of a few tens of micrometers, thereby precisely controlling the resonant frequency. Use of such techniques is not possible with the prior art bulk technology, nor is the prior art bulk technology applicable to these new high temperature superconductor materials.

OBJECTS AND ADVANTAGES

It is therefore an object of this invention to utilize a high temperature superconductor to obtain a very high quality factor magnetic resonance probe coil for use as a detector of small magnetic fields, either in medical applications or in other non-contact applications such as non-destructive evaluation (NDE). Not only does the use of a superconductor confer the advantage of low loss (high-Q) operation, but it offers a high Q in the relatively low frequency range, 1 to 1000 MHz, most useful for magnetic resonance imaging. The high critical temperature of the superconductor allows operation with much less stringent cooling requirements than earlier magnetic resonance detector systems, which were made with low critical temperature materials. Because earlier systems were unable to achieve the high quality factors of the current invention, very high magnetic fields were required for similar sensitivity. This necessitated the use of superconducting magnets, which were invariably cooled to less than 30K. Such extreme cooling requirements resulted in large and ungainly systems in which the cooling subsystem was often larger than the detecting subsystem itself. The higher operating temperature of the current invention reduces the need for excessive real estate merely to house a refrigerator.

It is a further object of this invention to offer an easily manufacturable magnetic resonance probe coil. The interdigitated design can be implemented in a single layer of superconducting material. It does not require two or more superconducting elements to pass each other without making electrical contact, and so it does not require the use of intermediate insulating layers. This elimination of a crossover reduces the number of required deposition steps to one, greatly increasing the manufacturing yield of the process. This design for manufacturability has never before been suggested for a magnetic resonance probe coil.

It is yet a further object of the invention to provide a broadened range of frequency of operation while maintaining acceptably low loss. The addition of a matching network, also made with superconducting material, allows operation over a frequency range up to 100 times the reciprocal of the quality factor of the probe coil, while adding only 13 dB of loss. It is the extremely small loss inherent in the superconducting coil and network that provide this flexibility.

SUMMARY

In brief, then, this application discloses a superconducting probe coil useful for detecting magnetic resonances in the 1 to 1000 MHz range. The coil is made from a single layer of high temperature superconductor, and operates at temperatures higher than 30K. The coil is an interdigitated spiral and so does not require that the superconductor cross itself.

We also disclose a superconductive matching network which couples the probe coil to an external preamplifier. This network broadens the bandwidth of the system by a factor of 100 or more while maintaining an acceptably low loss figure.

BRIEF DESCRIPTION OF THE DRAWINGS

FIG. 1 is a schematic view of a magnetic resonance probe coil with a five turn spiral inductor.

FIG. 2 is a schematic view of a magnetic resonance probe coil with a two turn spiral inductor made up of concentric arcs.

FIG. 3 is an enlargement of part of the probe coil of FIG. 2, showing more clearly the interdigitated capacitors.

DESCRIPTION OF THE PREFERRED EMBODIMENT

Figure 4:
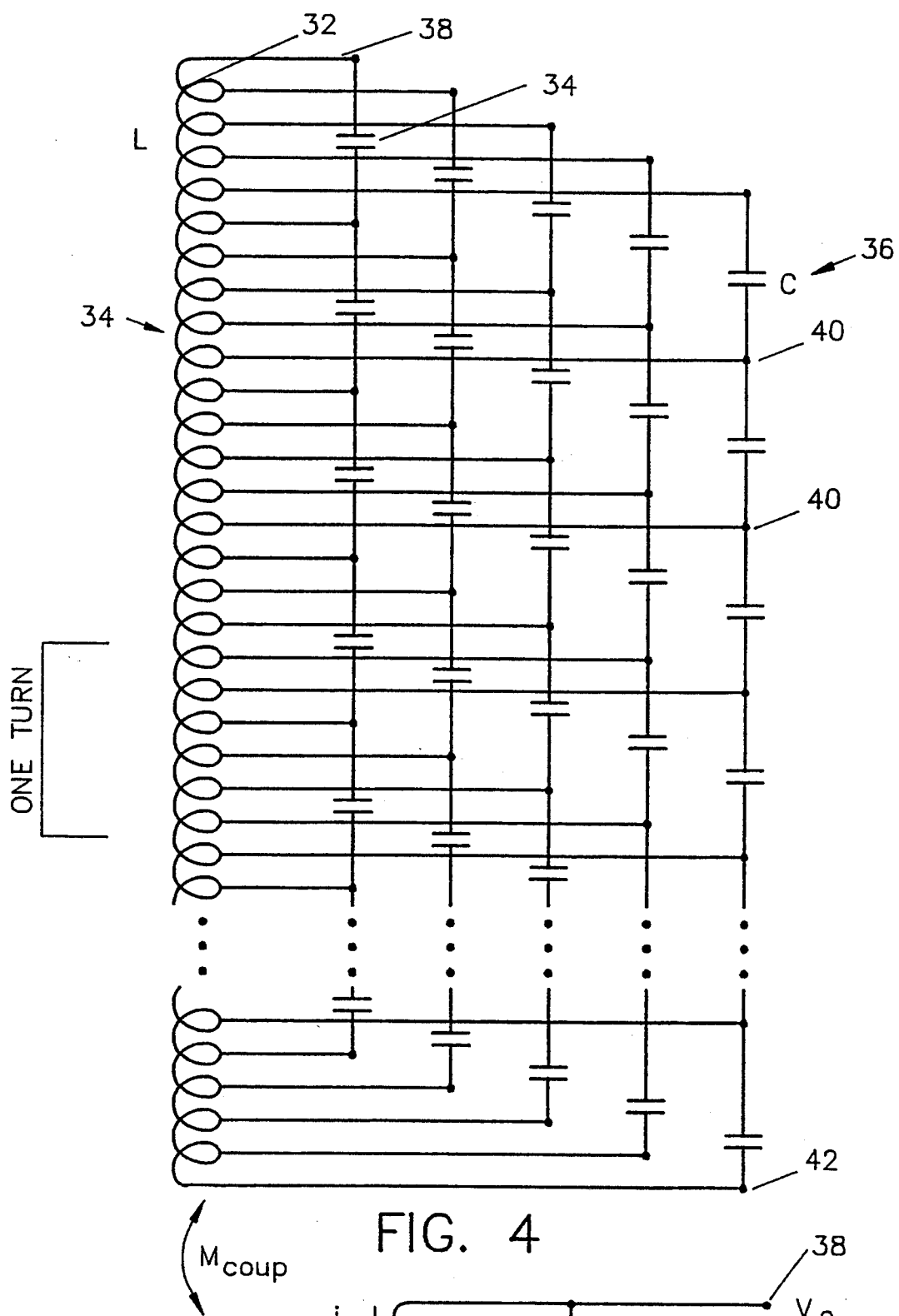
FIG. 4 is the equivalent circuit diagram of the probe coil, with some of the repeated intermediate elements left out for clarity.

The probe coil (20) of this invention is illustrated in FIG. 1. The primary part of the resonant sensor is the spiral inductor (22), consisting of several turns of a superconducting film (24). These turns may be literally a spiral, or they may be concentric circles, slit over short parts of their circumference, and connected with primarily radial segments to effect a functional spiral, or they may even be straight line segments of decreasing length joined to effect a functional spiral. The particular embodiment illustrated in FIG. 1 is a spiral with five turns, while FIG. 2 shows a two-turn spiral made up of slit concentric circles.

Distributed throughout the inductor are interdigital capacitive elements (26). These elements may be formed, for example, by bringing narrow finger electrodes (28) from each turn of the spiral towards the neighboring turn(s) in an alternating fashion. An expanded view of these fingers can be seen in FIG. 3. A more conventional resonant probe coil configuration would use a separate inductor and capacitor. This conventional design would require a second layer of conductor to pass over the first layer without electrical connection. Because the second layer must in this application also be superconductive in order to not exceed the maximum allowable resistance, the structure would be much more difficult to produce. In the present invention a self-resonant mode of operation is achieved by distributing the capacitance throughout the inductance of the sensor coil.

FIG. 4 is an equivalent circuit model of the invention. The spiral inductor (22) is represented by a single inductor (30), which is tapped, at numerous points (32) by the elements (34) of the distributed capacitor (36). An expanded view of the first few elements can be found in FIG. 5. The first terminal (38) is at the top and is labeled $v_0$. The second terminal (40) of each elemental capacitor (34) is connected to another tap (32) on the inductor (30). In all cases the separation of the taps (32) to which a given elemental capacitor (34) is connected corresponds to one turn of the inductor (22). The last terminal (42) is at the bottom. The first and last terminals (38, 42) may be connected to a preamplifier (44) through a capacitor, or may be connected to nothing except by magnetic coupling.

Figure 5:
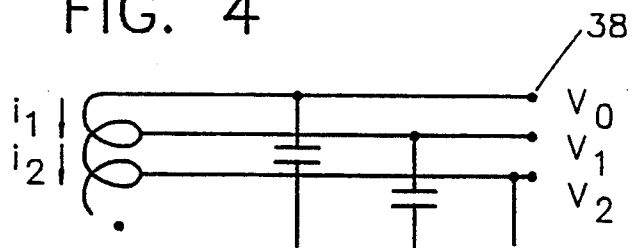
FIG. 5 is a detail of the equivalent circuit diagram of FIG. 4, showing some of the circuit parameters.

The performance of the circuit can be analyzed by applying well known standard circuit theory to the equivalent circuit of FIG. 4, assuming a reasonable number of elemental capacitors (perhaps 10 to a few thousand). For the particular case in which there are N turns in the spiral, each turn having K interdigital capacitors (one per tap) of capacitance C, and all turns being approximately the same diameter so that all tap-to-tap self-inductances L and mutual inductances M are approximately equal, the following difference equations apply:

$$v_p - v_{p-1} = \qquad (1)$$

$$-M d/dt \sum_{q=1}^{NK} i_q + M_{sample} d/dt \, i_{sample} + M_{coup} d/dt \, i_{coup}$$

$$i_p - i_{p-1} = C \, d/dt(v_{p+K-1} - 2v_{p-1} + v_{p-K-1}) \qquad (2)$$

where the loop currents $i_p$ and node voltages $v_p (0 \leq p \leq KN;\ i_0 = 0;\ v_p = 0$ for $p \leq 0;\ v_p = v_{KN}$ for $p > KN)$ are as defined in FIG. 5. $M_{sample}$ and $M_{coup}$ are the mutual inductances between each loop element and the sample under examination and the preamplifier, respectively, and $i_{sample}$ and $i_{coup}$ are the currents in those elements. Note that, in FIG. 4, K = 5.

Also note that, for this ideal planar coil, $L = M = L_s K^2$, where $L_s$ is the inductance of a single loop.

Clearly Equations (1) and (2) can be generalized for cases in which the C, M, and L values vary from tap to tap.

Making the usual sinusoidal steady state assumption of $v_p = \text{Re}[V_p e^{j\omega t}]$ and $i_p = \text{Re}[I_p e^{j\omega t}]$, where $V_p$ and $I_p$ are complex numbers and j is $\sqrt{(-1)}$, one can rewrite (1) and (2) as $$V_p - V_{p-1} = j\omega \left[ -M \sum_{q=1}^{NK} I_q + M_{sample}I_{sample} + M_{coup}I_{coup} \right] \quad (3)$$

$$I_p - I_{p-1} = j\omega C[V_{p+K-1} - 2V_{p-1} + V_{p-K-1}] \quad (4)$$

Alternatively, one may convert the discrete model to a continuous one, obtaining differential equations (5) and (6) below which correspond to (3) and (4) respectively:

$$dV/dp = j\omega \left[ -M \int_{q=1}^{NK} I(q)dq + M_{sample}I_{sample} + M_{coup}I_{coup} \right] \quad (5)$$

$$dI/dp = j\omega CKd^2V/dp^2 \quad (6)$$

Equation (6) is valid only when there is no abrupt change between neighboring turns of the spiral; it is not accurate at the inner and outer turns of the probe coil. These two equations, however, make it clear (as do the corresponding difference equations) that the current is approximately constant along the length of the line, except at the inner and outer turns.

A further approximation provides more insight. Suppose that all capacitance in a single turn of the spiral is collected in a single lumped capacitance; this would be the case $K=1$ in the above analysis. The lumped element circuit of FIG. 6 results. For this circuit, with $L_p = M = L_s$, the single turn inductance, and $C_p = C$, the following difference equations for the complex amplitudes result:

$$V_p - V_{p-1} = j\omega[-M\Sigma I_q + M_{sample}I_{sample} + M_{coup}I_{coup}] \text{ for } 1 \leq p \leq N \quad (7)$$

$$I_p - I_{p-1} = j\omega C(V_p - 2V_{p-1} + V_{p-2}) \text{ for } 2 \leq p \leq N \quad (8)$$

and, at the end, $$I_1 = j\omega C(V_1 - V_0)$$

which can be applied to (8) to yield, by extension, $$I_p = j\omega C(V_p - V_{p-1}) \text{ for } 1 \leq p \leq N$$

From this equation, Equation (7) gives $$(1 - \omega^2 NCM)I_p = -\omega^2 C[M_{sample}I_{sample} + M_{coup}I_{coup}] \quad (9)$$

From this it is clear that the current is constant along the length of the spiral and that the coil has a resonant frequency given by $$\omega_{res} = \omega_s/N^{0.5} \quad (10)$$

where $\omega_s = (MC)^{-0.5}$ is a single-turn resonant frequency.

A device has been designed using these principles and has been fabricated in a thin film of $YBa_2Cu_3O_{7-\delta}$ (YBCO) deposited on 5 cm-diameter $LaAlO_3$. The design is shown in FIG. 2. A single turn inductance of 0.1 μH and a lumped single turn capacitance (half of the total device capacitance) of 0.6 nF is expected for this two turn coil, from which Equation (10) predicts a resonant frequency of about 15 MHz. A more precise analysis based on fully distributed capacitance (and differential equations similar to Equations 5 & 6) predicts a resonant frequency of 20 MHz and a current distribution which is approximately sinusoidal, being zero at the ends of the spiral inductor and having a single maximum near the midpoint of the length of the coil. The fact that the current distribution is unidirectional (i.e., at a given moment in time, the current flow at all points in the inductor has the same clockwise or counterclockwise sense) is very important in maximizing the sensitivity of the coil to external fields. The realization that the fundamental self-resonant mode has this property is nonobvious; in fact, it is contrary to the advice given by experts in the field that self-resonant modes are not useful for this purpose because of nonunidirectonal current flow.

Figure 6:
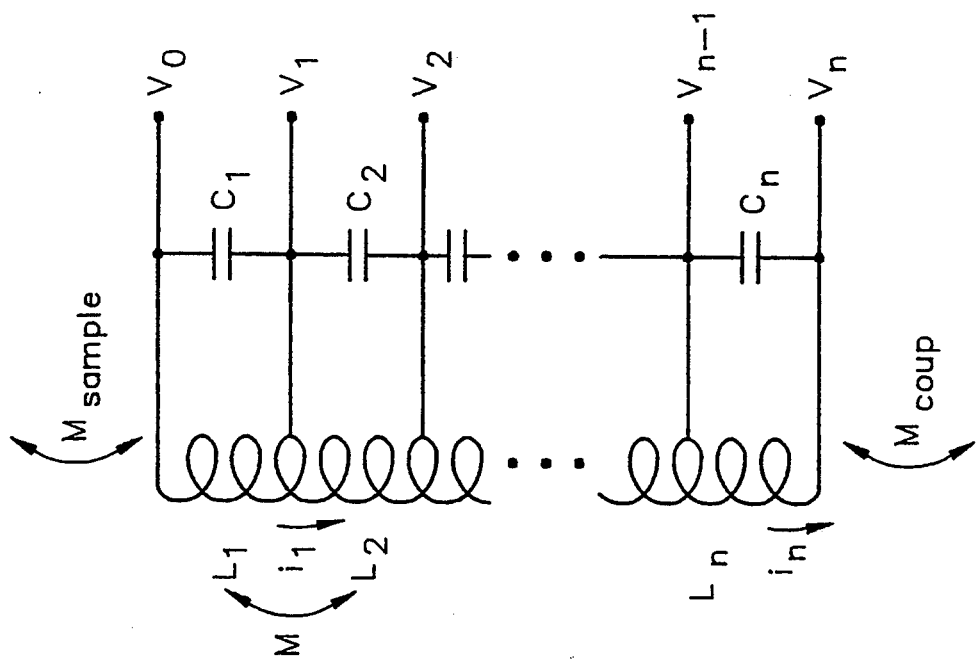
FIG. 6 is a simplified equivalent circuit diagram of the probe coil, where all of the capacitance of each turn is combined into a lumped capacitor.
Figure 8:
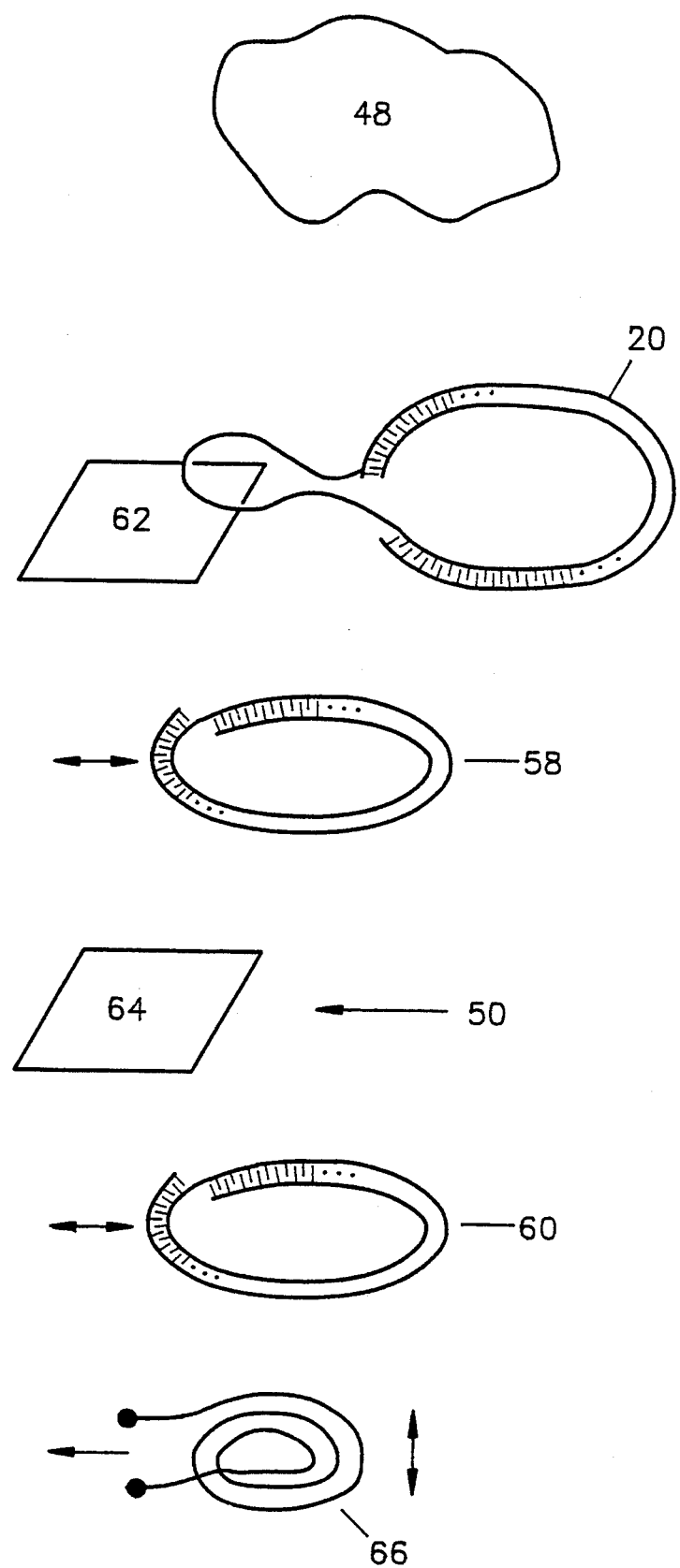
FIG. 8 is a schematic view of the operating configuration of the probe coil in conjunction with a broadband matching network coupled to a preamplifier.

In practice, the sensor would be placed near the source of magnetic signal, as shown schematically in FIG. 8. In an MRI application, this would be the object to be imaged (48). Transfer of the signals in the sensor to the signal processing, display, and recording systems may be achieved by an appropriate matching network (50). For example, ohmic contacts may be placed on the two terminals of the outer turn of the inductor (52, 54). Direct electrical connection may be made to these terminals through a capacitor of relatively low value, ensuring that the resonator is not excessively loaded, and the signals from the circuit applied to an appropriate low noise amplifier. Alternatively, coupling to the circuit may be achieved inductively (as shown in FIGS. 4, 6, and 8), perhaps to a small normal-metal coil which is external to the cryogenic enclosure of the circuit.

Figure 9:
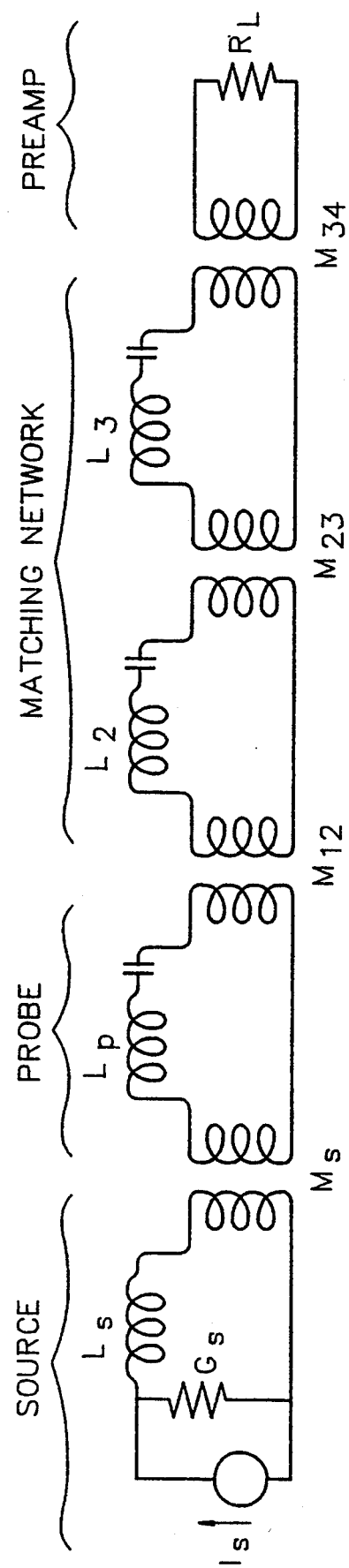
FIG. 9 is the equivalent circuit diagram of the matching network of FIG. 8.
Figure 10:
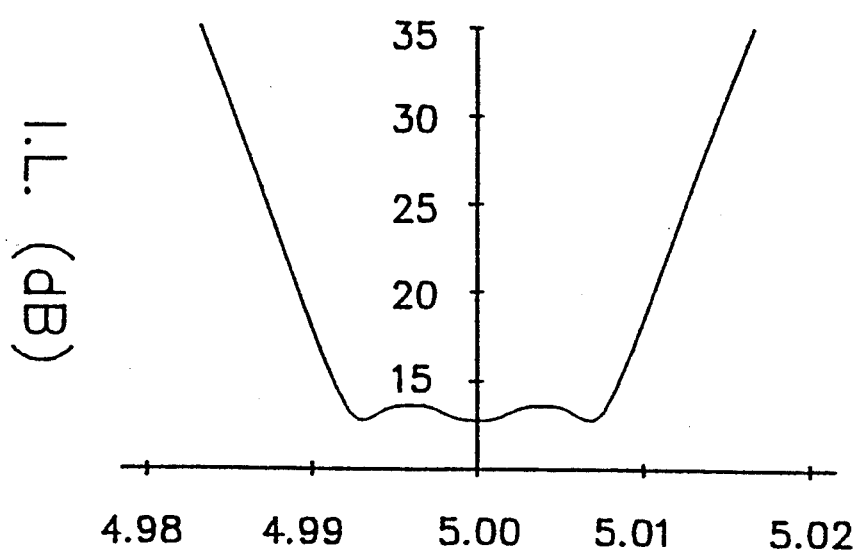
FIG. 10 shows the calculated bandwidth response of the matching network of FIG. 9.

The coupling schemes described above except for the one illustrated in FIG. 8 will yield a fractional coupling bandwidth of $1/Q_1$, where $Q_1$ is the loaded Q of the probe, which may be sufficient for the imaging application. If more bandwidth is required, a broadband matching network similar to the one shown schematically in FIG. 9 may be used. In this figure, the source, represented by the current source $I_s$, conductance $G_s$, and inductance $L_s$, is coupled to the probe coil $L_p$ by the mutual inductance $M_s$. A two-section matching network ($L_2$ and $L_3$) is magnetically coupled to the probe coil and to the preamplifier. This network can be designed (using techniques which have been developed for unrelated impedance-matching and filtering applications) to yield a bandwidth which is 100 or more times larger than the probe bandwidth $1/Q_1$, at the price of additional loss of signal energy at the preamplifier. Because noise from the source is also suppressed, this results in no loss of performance unless the preamplifier noise or probe and matching network noise becomes dominant. FIG. 10 shows the calculated performance of the circuit shown in FIG. 9. In this case, a 100-fold broadening in bandwidth is obtained at a cost of 13 dB in signal strength. Low-loss matching sections $L_2$ and $L_3$ are required, which mandates that these also be superconductive. The matching sections can in fact be similar in structure to the probe coil, possibly coupled to the probe coil through apertures in superconductive planes as shown in FIG. 8.

The matching network (50) shown schematically in FIG. 8 consists of a probe coupling loop (56), two matching coils (58, 60), two conducting shields (62, 64), and an output coupling coil (66). The conducting shields (62, 64) adjust the degree of coupling between the matching coils by changing their mutual inductance. To minimize the loss in the matching network (50), all of the shields and matching coils are superconductive. The matching network (50) is coupled to the output, a preamplifier, through a normal (non-superconductive) output coupling coil (66).

Other applications of such a low loss inductor, and LC circuit, include switching RF power supplies, such as are used in RF heating systems. In addition to the low loss, these applications require that the inductor be capable of handling relatively large currents.

The requirement of a very low loss substrate makes the requirement for only a single superconductive layer even more critical. Sapphire, a single crystal form of alumina ($Al_2O_3$), has the lowest dielectric loss of any readily available substrate material. Sapphire is inexpensive, very stable mechanically, and available in a wide variety of shapes and sizes. Its thermal expansion coefficient, however, is poorly matched to those of the high temperature superconductors. As a result, superconducting films grown on sapphire substrates experience mechanical stress when thermally cycled. Thin films, up to a few hundred nanometers, can successfully withstand this stress, but the probability of damage to the superconducting properties of the film increases with the film thickness. If more than one layer of superconductor is required, the total thickness of the superconductive structure may exceed the critical thickness above which the superconductive properties degrade due to cracking or other types of mechanical failure.

Yet another advantage of this single layer design is the absence of crossovers. A structure in which one conducting layer passes over another without electrical connection is difficult to achieve epitaxially. In addition to the deposition and patterning of two conducting layers, an insulating layer deposition and patterning step is required. The complexity of this manufacturing process is much greater than for a process requiring only the deposition of a single conducting layer.

OPERATIONAL DESCRIPTION

In practice the probe coil is placed between a source and an output device or signal processing electronics. The source may be biological tissue, a weld in an airplane wing, or any other object capable of producing an alternating magnetic field. When the frequency of the source magnetic field is far away from the resonant frequency of the probe coil, very little signal energy is transferred to the output. Near this resonant frequency, however, large currents are induced in the probe coil and are coupled to the output. Because the probe coil need not be physically connected to either the source or the output, only the probe coil (and matching network, if any) need be cooled.

Figure 7:
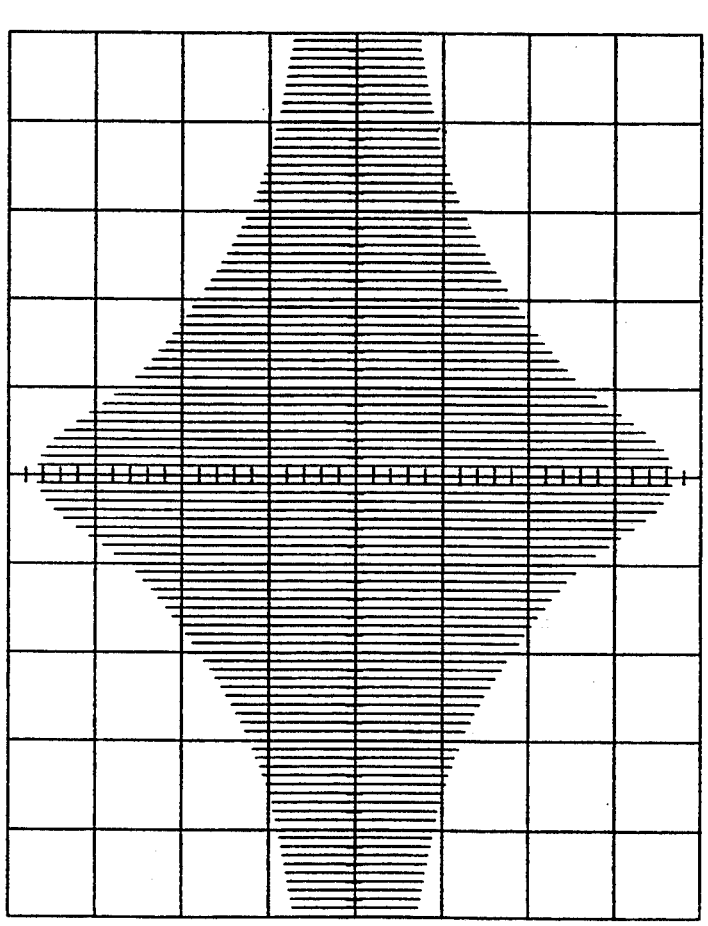
FIG. 7 shows the frequency response of the probe coil of FIG. 2, when the substrate is $LaAlO_3$ and the coil is patterned in a thin film of $YBa_2Cu_3O_{7-\delta}$.

FIG. 7 shows the behavior of the sensor shown in FIG. 2 across its fundamental resonant mode. This sensor was fabricated by epitaxially depositing $YBa_2Cu_3O_{7-\delta}$, a high temperature superconductor material with a critical temperature of about 90K, onto a substrate of $LaAlO_3$. The superconductor film was then subjected to conventional photolithography to form the pattern shown in FIG. 2. One room temperature single loop coil, just external to the cryogenic enclosure holding the sensor in liquid nitrogen at approximately 77K, was driven by a synthesized frequency source. A second coil on the far side of the enclosure was connected to an oscilloscope to function as the output. The signal from the second coil drives the y axis of the scope, while the frequency generated by the synthesizer drives the x axis. The quality factor (Q) is equal to the peak frequency (f) divided by the full width of the frequency response ($\Delta f$) measured at half the maximum power. FIG. 7 shows that a quality factor of approximately 10,000 was achieved at the fundamental frequency of 18.5 MHz (compared to the 15 MHz predicted by Equation 10 and 20 MHz predicted by Equations 5 & 6). A second device of identical design had a similar Q at a fundamental resonant frequency of 18.7 MHz. It is suspected that this slightly higher frequency was the result of a few broken fingers in the capacitor. These experimental results clearly show that Q factors within the desired range are achievable. It is anticipated that even higher values of Q will be attained using substrates with lower dielectric loss, such as sapphire.

CONCLUSION, RAMIFICATIONS AND SCOPE

It is thus apparent that the magnetic resonance probe coil of the present invention offers superior performance and greater ease of manufacturing than were heretofore available. The use of a superconductor for the probe coil offers unprecedented sensitivity. Much smaller signals can therefore be detected making the use of extremely high magnetic fields unnecessary. This in turn eases the requirement for cryogenic cooling subsystems in MRI systems. Instead of cooling a large bank of superconducting magnets, only a relatively small probe coil must be chilled. Furthermore, the use of high temperature superconductors relaxes the cooling requirements even more. Rather than expensive and unwieldy cooling equipment necessary for operating temperatures below 30K, inexpensive and plentiful liquid nitrogen can be used.

Another advantage that this magnetic resonance probe coil offers is ease of manufacturing. The structure contains only one superconductive layer atop a substrate. Multiple deposition and patterning steps are avoided, as are possible mechanical instabilities associated with complex multilayer structures.

The extremely high quality factor of the probe even makes it possible to broaden the bandwidth by using a matching network. Because the cost of higher bandwidth is generally more loss, the bandwidth can only be broadened for a probe coil that operates well within the limits of signal detection for a given application. This magnetic resonance probe coil, then, allows the flexibility of detecting very weak signals over a broad frequency range, while offering detection of extremely weak signals over a narrower range.

While the above description contains many specific details, these should not be construed as limitations on the scope of the invention, but rather as an exemplification of one of its preferred embodiments. Many other variations are possible and will no doubt occur to others upon reading and understanding the preceding description. Accordingly, the scope of the invention should be determined not by the embodiment illustrated, but by the appended claims and their legal equivalents.

What is claimed is:

1. A broadband matching network for coupling a magnetic resonance probe coil to a preamplifier, comprising:
    at least one matching coil having an inductive element and a capacitive element, said inductive element and said capacitive element both made of superconducting material, said matching coil being inductively coupled to said magnetic resonance probe coil and said matching coil being inductively coupled to said preamplifier.

2. The network of claim 1 wherein said magnetic resonance probe coil has a loaded quality factor, and said broadband matching network couples said probe coil to said preamplifier over a bandwidth substantially greater than the reciprocal of the loaded quality factor of said magnetic resonance probe coil.

3. The network of claim 1, further comprising a probe coupling loop, said probe coupling loop directly connected to said magnetic resonance probe coil and inductively coupled to said at least one matching coil.

4. The network of claim 1, further comprising an output coil inductively coupled to said at least one matching coil and directly coupled to said preamplifier.

5. The network of claim 1, wherein said at least one matching coil comprises a first matching coil and a last matching coil, said first matching coil inductively coupled to said magnetic resonance probe coil, said last matching coil inductively coupled to said preamplifier, and said first matching coil inductively coupled to said last matching coil.

6. The network of claim 1, further comprising a means for modifying the mutual inductance of any two of the coils.

7. The network of claim 6, wherein the modifying means comprises a superconducting shield slidably interposed between the two coils.

8. The network of claim 1, wherein said superconducting shield is slidably interposed between said magnetic resonance probe coil and said at least one matching coil.

9. The network of claim 7, wherein said superconducting shield is slidably interposed between said preamplifier and said at least one matching coil.

10. The network of claim 3, further comprising an output coil inductively coupled to said at least one matching coil and directly coupled to said preamplifier.

11. The network of claim 3, wherein said at least one matching coil comprises a first matching coil and a last matching coil, said first matching coil inductively coupled to said magnetic resonance probe coil, said last matching coil inductively coupled to said preamplifier, and said first matching coil inductively coupled to said last matching coil.

12. The network of claim 5, further comprising an output coil inductively coupled to said at least one matching coil and directly coupled to said preamplifier.

13. The network of claim 5, further comprising a superconducting shield slidably interposed between any two of the coils for modifying the mutual inductance of the two coils.

14. The network of claim 13, wherein said superconducting shield is slidably interposed between said magnetic resonance probe coil and said first matching coil.

15. The network of claim 13, wherein said superconducting shield is slidably interposed between said preamplifier and said last matching coil.

16. The network of claim 12, further comprising a probe coupling loop, said probe coupling loop directly connected to said magnetic resonance probe coil and inductively coupled to said first matching coil.

17. The network of claim 12, further comprising a superconducting shield slidably interposed between said magnetic resonance probe coil and said first matching coil.

18. The network of claim 12, further comprising a superconducting shield slidably interposed between said last matching coil inductively coupled and said preamplifier.

19. The network of claim 12, further comprising a first superconducting shield slidably interposed between said magnetic resonance probe coil and said first matching coil, and a second superconducting shield slidably interposed between said last matching coil inductively coupled and said preamplifier.

20. The network of claim 1, wherein said magnetic resonance probe coil has an unloaded resonant quality factor of at least $10^4$.

21. A broadband matching network for coupling a magnetic resonance probe coil to a preamplifier, comprising:

a probe coupling loop directly connected to said magnetic resonance probe coil, a first matching coil and a last matching coil, each coil having an inductive element and a capacitive element, said inductive element and said capacitive element both made of superconducting material, an output coil for inductively coupling said matching coil to said preamplifier, said probe coupling loop being inductively coupled to said first matching coil, said first matching coil being inductively coupled to said last matching coil, and said last matching coil being inductively coupled to said output coil, and said output coil directly coupled to said preamplifier.

22. The network of claim 21, further comprising a first superconducting shield slidably interposed between said probe coupling loop and said first matching coil, and a second superconducting shield slidably interposed between said last matching coil and said output coil.

23. The network of claim 22 wherein said magnetic resonance probe coil has a loaded quality factor, and said broadband matching network couples said probe coil to said preamplifier over a bandwidth substantially greater than the reciprocal of the loaded quality factor of said magnetic resonance probe coil.

* * * * *